Oct. 16, 1962 H. T. LYMAN 3,059,195

MULTI-BAND RADIO FREQUENCY TUNER

Filed April 9, 1959 4 Sheets-Sheet 1

INVENTOR.
Harold T. Lyman

BY Dons, McDougall, Williams & Hersh
Attorneys

Oct. 16, 1962 H. T. LYMAN 3,059,195

MULTI-BAND RADIO FREQUENCY TUNER

Filed April 9, 1959 4 Sheets-Sheet 2

INVENTOR.
Harold T. Lyman

BY

Dons, McDougall, Williams & Hersh
Attorneys

MULTI-BAND RADIO FREQUENCY TUNER

Filed April 9, 1959

INVENTOR.
Harold T. Lyman
BY
Owen, McDougall, Williams & Hersh
Attorneys

INVENTOR.
Harold T. Lyman
BY
Owens, McDougall, Williams & Hersh
Attorneys

United States Patent Office 3,059,195

Patented Oct. 16, 1962

3,059,195

MULTI-BAND RADIO FREQUENCY TUNER

Harold T. Lyman, Milford, Conn., assignor to Aladdin Industries, Incorporated, Nashville, Tenn., a corporation of Illinois Filed Apr. 9, 1959, Ser. No. 805,306

6 Claims. (Cl. 336—77)

This invention relates to tuners for very high and ultrahigh-frequency bands, such as the bands employed for commercial television broadcasting.

One object of the present invention is to provide a new and improved tuner adapted to cover a plurality of frequency bands at extremely high radio frequencies.

A further object is to provide a new and improved tuner of the foregoing character, in which the changeover from one band to another is effected by moving a band changing electrode in successive steps along an inductive element.

Another object is to provide a new and improved tuner of the foregoing character, in which the inductive element is arranged so as to provide a cavity resonator for an ultrahigh-frequency band, while providing lumped inductance in the form of one or more coils, to cover the very high-frequency bands.

A further object is to provide such a tuner which is arranged in a new and improved manner so that the tuning within the bands is accomplished by variation of the capacitance in the tuned circuit.

Another object is to provide a new and improved tuner of the foregoing character which is so arranged that the tuner may be tracked to predetermined tuning curves for all of the bands covered by the tuner.

A further object is to provide such a tuner having a new and improved tracking device which is coupled to the band changing arrangement so as to provide independent tracking for each of the bands covered by the tuner.

Still another object is to provide a new and improved tuner which is easy to manufacture and low in cost, yet is capable of covering all of the ultrahigh-frequency (UHF) and very high-frequency (VHF) bands currently employed for commercial television broadcasting.

Further objects and advantages of the present invention will appear from the following description, taken with the accompanying drawings, in which.

Figure 9:
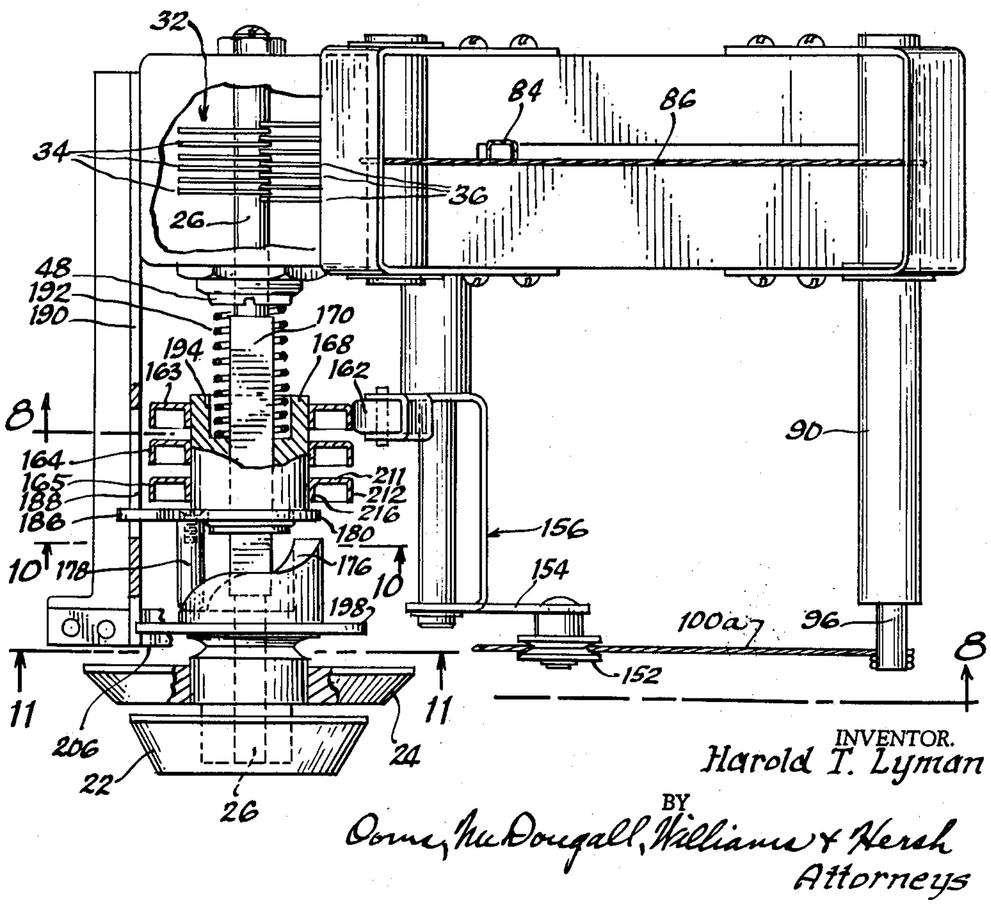
FIG. 9 is a plan view showing the modified tuner of FIG. 8, certain parts being broken away and shown in section.
Figure 10:
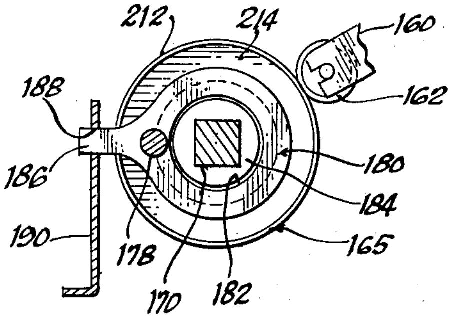
Figure 11:
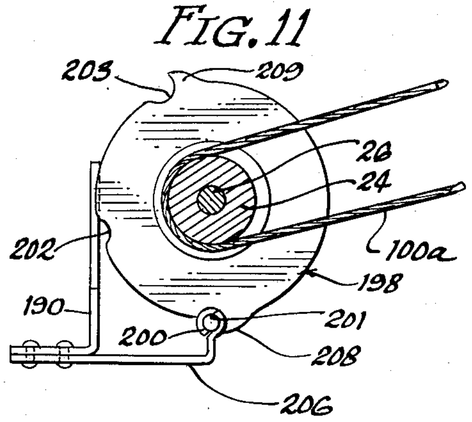

FIGS. 10 and 11 are fragmentary sections, taken generally along lines 10—10 and 11—11 in FIG. 9.

FIGS. 1–7 illustrate a tuner 20 adapted to cover a plurality of frequency bands at extremely high radio frequencies. Specifically, the illustrated tuner 20 will cover the three VHF and UHF bands employed for commercial television broadcasting. These bands comprise the low-frequency VHF band (channels 2 through 6), the high-frequency VHF band (channels 7 through 13), and the UHF band (channels 14 through 83).

As shown, the tuner 20 has coaxial control knobs 22 and 24. The knob 22 is the main tuning control, employed for tuning within each of the bands, while the knob 24 is the band changing control. It will be seen that the knobs 22 and 24 are mounted on coaxial shafts 26 and 28. The shaft 26 extends through a bore 30 in the shaft 28. Thus, the band changing shaft 28 is rotatable about the main tuning shaft 26.

For the UHF band, the tuner 20 provides a cavity resonator. Lumped inductances are provided to cover the two VHF bands, the tuning within each band accompanied by a variable condenser 32. While various condenser constructions may be employed, the illustrated condenser 32 has a plurality of grounded rotor plates 34 which are secured to the main tuning shaft 26. The rotor plates 34 are adapted to mesh with a series of insulated stator plates 36. The shaft 26 is made of metal so as to ground the rotor plates 34.

Figures 2, 3, 6C:
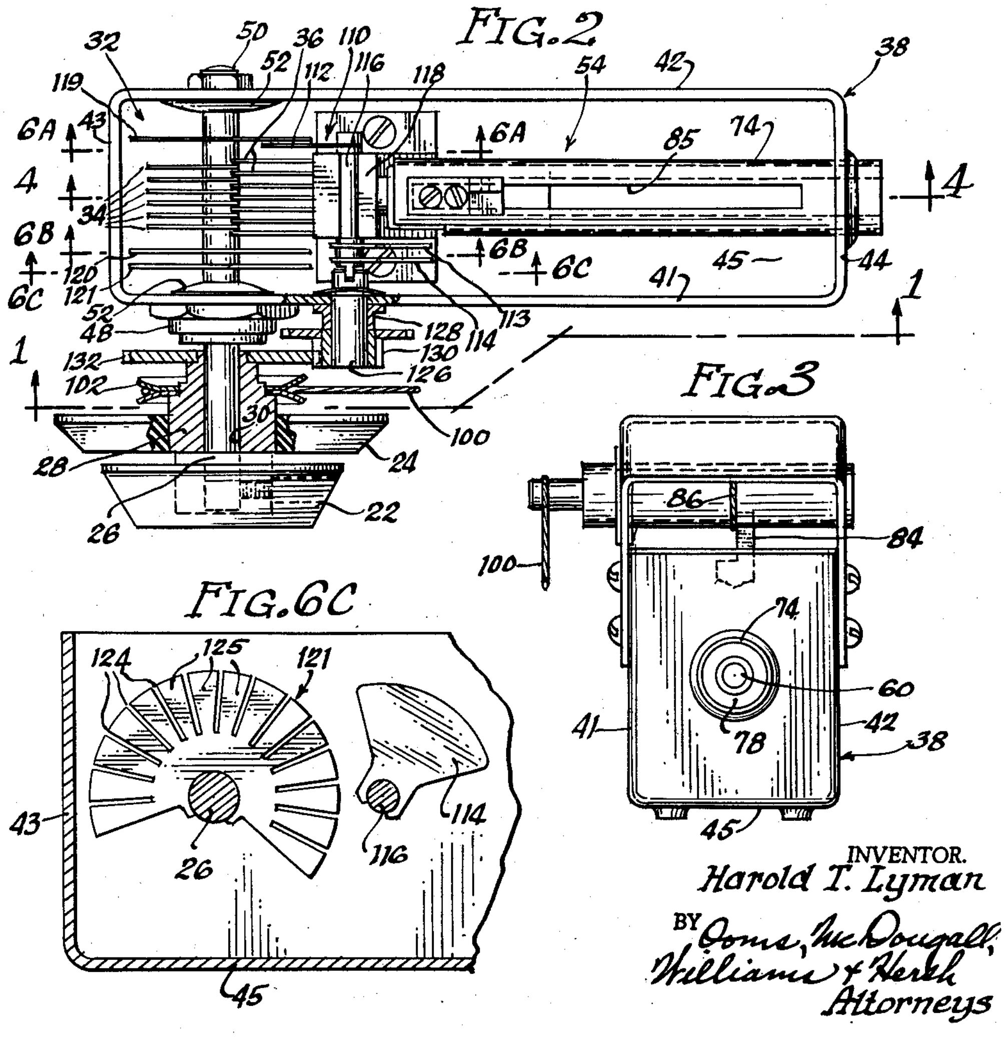
FIG. 2 is a plan view of the tuner, with certain parts broken away and shown in section.
FIG. 3 is a right side elevational view, with certain parts removed and broken away.
FIGS. 6A, 6B and 6C are fragmentary sections, taken along lines 6A—6A, 6B—6B, and 6C—6C in FIG. 2.

It will be seen that the variable condenser 32 is mounted within a housing 38 which forms the enclosure portion of the cavity resonator for UHF tuning. Thus, the housing 38 is made of metal or other conductive material. As shown, the housing 38 is generally rectangular and is formed with front and rear walls 41 and 42, left and right-hand side walls 43 and 44, a bottom wall 45, and a top wall 46. The side and bottom walls 41—45 may be formed as one piece, while the top wall may be formed separately and may be removably mounted on the housing 38. In FIG. 2, the housing is shown with the top wall 46 removed.

The main tuning shaft 26 extends through the front wall 41 and is journalled in bearings 48 and 50 mounted on the front and rear walls 41 and 42. Front and rear wiper springs 52 may be employed to ground the shaft 26 to the housing 38.

The stator plates 36 of the variable condenser 32 are connected to the left-hand end of an inductive element or device 54 adapted to complete the cavity resonator for UHF tuning, while providing lumped inductance for VHF tuning. As shown to advantage in FIG. 4, the inductive element 54 is formed with three successive portions 56, 57 and 58 for covering the three bands. The inductive portion 56, in conjunction with the other cavity components, provides sufficient inductance for the UHF band. Additional inductance is provided by the inductive portion 57 for the high VHF band. Still more inductance is afforded by the inductive portion 58 for the low VHF band. Thus, all three inductive portions 56, 57 and 58 are connected in series. The left-hand end of the inductive portion 56 is connected to the stator plates 36, while the right-hand end is connected to the left-hand end of the inductive portion 57. The left-hand end of the inductive portion 58 is connected to the right-hand end of the inductive portion 57.

As shown, the inductive portion 56 for UHF tuning comprises a substantially cylindrical conductor in the form of a metallic coating on the outside of a cylindrical form or support 60. The portion 57 comprises a coil extending helically around the cylindrical support 60, which may be made of glass, plastic or other suitable insulating material. The coil 57 need comprise only a few turns to provide sufficient lumped inductance for tuning the high VHF band. It will be apparent that the inductive portion 58 also comprises a coil having a number of additional turns to provide sufficient additional lumped inductance for tuning the low VHF band.

Figure 4:
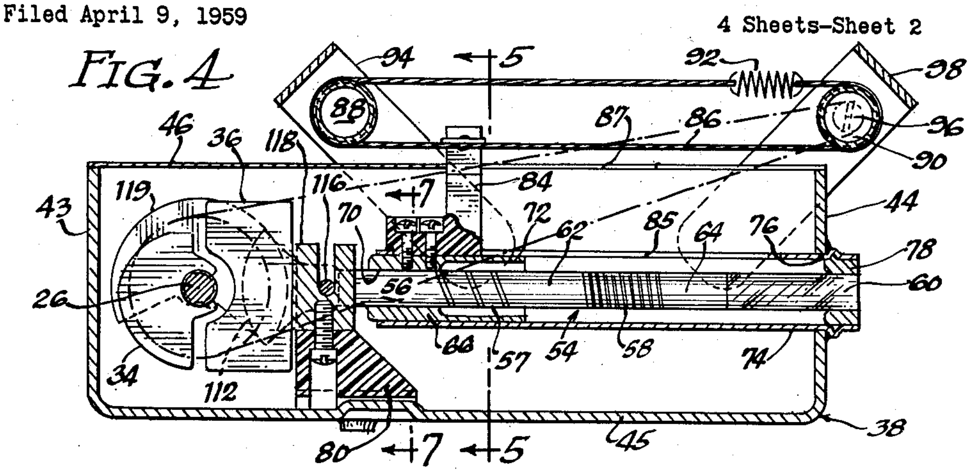
FIG. 4 is a longitudinal section, taken generally along a line 4—4 in FIG. 2.
Figure 5:
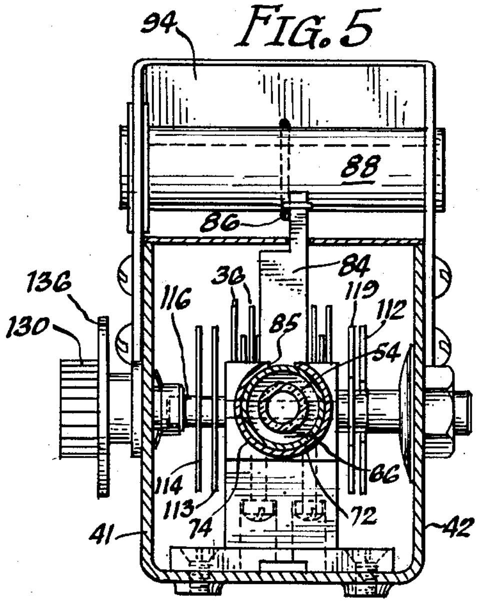
FIG. 5 is a transverse section, taken along a line 5—5 in FIG. 1.

From FIG. 4, it will be apparent that a substantially cylindrical, conductive electrode 62 is interposed between the right-hand end of the coil 57 and the left-hand end of the coil 58. Similarly, a substantially cylindrical electrode 64 is connected to the right-hand end of the coil 58. All of the elements 56, 57, 58, 62 and 64 may be formed simultaneously on the support 60 by suitable circuit printing techniques. In this case, the inductive element 54 may be manufactured at extremely low cost.

The changeover between bands is effected by moving a conductive sleeve or ring 66 along the successive portions 56, 57, 62, 58 and 64 of the inductive element 54. The sleeve 66 is adapted to be coupled to the cylindrical elements 56, 62 and 64. When the sleeve 66 is coupled to the cylindrical conductor 56, only the left-hand portion of the conductor 56 is in the tuned circuit between the sleeve and the stator plates 36. When the sleeve 66 is moved to the cylindrical electrode 62, the coil 57 is introduced into the tuned circuit, in series with the cylindrical conductor 56. Moving the sleeve 66 to the cylindrical electrode 64 adds the coil 58 to the series circuit.

The sleeve 66 may be movable into direct sliding contact with the cylindrical elements 56, 62 and 64, in which case the sleeve will be conductively coupled to the elements 56, 62 and 64. However, it is preferred that the sleeve 66 be capacitively coupled to the cylindrical elements 56, 62 and 64. To this end, the illustrated sleeve 66 is insulated from the elements 56, 62 and 64 by dielectric means 68. It is preferred that the dielectric 68 take the form of a coating of insulating material, applied to the outside of the cylinders 56, 62 and 64, and also to the outside of the coils 57 and 58. The insulating coating not only insulates the sleeve from the cylinders and the coils, but also protects the coils and the cylinders against mechanical abrasion. It will be understood that the dielectric might be applied to the inside of the sleeve, or might simply take the form of an air gap between the sleeve and the cylindrical members.

The illustrated sleeve 66 has a main or left-hand portion 70 which is mounted around the inductive element 54 with a close but smooth sliding fit. This is the portion of the sleeve which is movable into closely coupled relation to the cylinders 56, 62 and 64. In addition, the sleeve has a right-hand portion or skirt 72 which has an enlarged inside diameter so as to be spaced outwardly from the inductive element 54. It will be apparent that the skirt 72 surrounds the unused portion of the inductive element, immediately adjacent the main sleeve portion 70. The skirt is loosely coupled to such unused portion and has the effect of suppressing spurious resonances which might otherwise develop in the unused portion.

To establish coupling to the movable sleeve 66, and to complete the cavity resonator for UHF tuning, the tuner 20 is provided with a generally cylindrical stationary tube or coupling sleeve 74, within which the sleeve 66 is movable. Thus, the tube 74 extends around the inductive element 64 but is spaced outwardly therefrom. The tube 74 extends to the left, along the longitudinal axis of the housing 38, from the right hand end wall 44 of the housing. In this case, the right-hand end of the tube 74 is conductively connected to the end wall 44, although in some cases the tube might be capacitively coupled to the end wall. As shown, the tube 74 extends through an opening 76 in the end wall 44 and is soldered or otherwise securely mounted thereon. The right-hand end of the insulating form 60 is centered within the tube 74 by means of a bushing 78.

The left-hand end of the support 60 is supported on an insulator 80, which also supports the stator plates 36. The insulator 80 is secured to the bottom wall 45 of the housing 38.

In some cases, the outside of the sleeve 66 might be conductively engaged with the inside of the tube 74. However, it is preferred to utilize capacitive coupling between the movable sleeve 66 and the stationary tube 74. Thus, in the illustrated arrangement, a dielectric member 82 is interposed between the sleeve 66 and the tube 74. As shown, the dielectric member 82 takes the form of a thin coating of insulating material, applied to the outside of the sleeve 66. Of course, the coating might be applied to the inside of the tube 74. The coatings 68 and 82 may be made of an epoxy plastic composition, or any other suitable low-loss insulating material.

Various mechanisms may be employed for moving the sleeve 66 along the inductive element 54. In this case, an insulating post 84 is secured to the upper side of the sleeve 66 to establish a mechanical connection thereto. The post 84 extends upwardly through longitudinal slots 85 and 87 in the tube 74 and the top wall 46. It will be seen that the upper end of the post 84 is connected to the lower flight of a belt or cord 86 which is strung around pulleys 88 and 90. The flights of the cord 86 are horizontal and are parallel to the path of the sleeve 66. A coil spring 92 may be connected into the upper flight of the cord 86 to keep the cord tight. The left-hand pulley 88 is rotatably mounted on a bracket 94. It will be seen that the right-hand pulley 90 is secured to a shaft 96 which is rotatably mounted on a bracket 98.

The shaft 96 is adapted to be rotated by a suitable drive, which, as shown, comprises a second cord or belt 100 wound around the shaft. The cord 100 is also strung around a pulley 102 secured to the band changing shaft 28. The upper flight of the cord 100 may be wrapped around or otherwise anchored to a lug 104 on the pulley 102. A coil spring 106 may be connected into the lower flight of the cord 100 to keep the cord tight. The cords or belts 86 and 100 may be made of any suitable non-stretching material, so that the initial calibration of the drive will be maintained.

When the band changing knob 24 is rotated, the cords 100 and 86 will be advanced. The movement of the cord 86 slides the sleeve 66 along the inductive element 54.

Figure 6A:
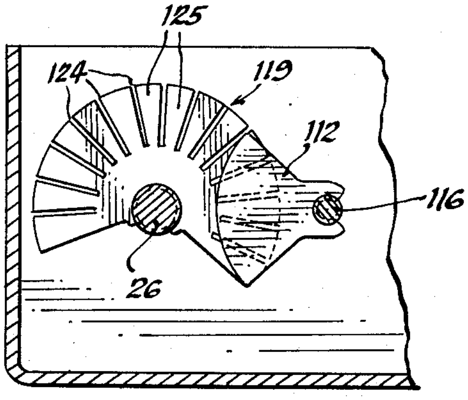
Figure 6B:
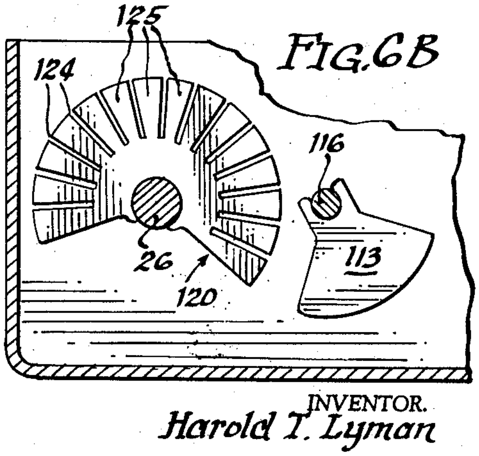
Figure 7:
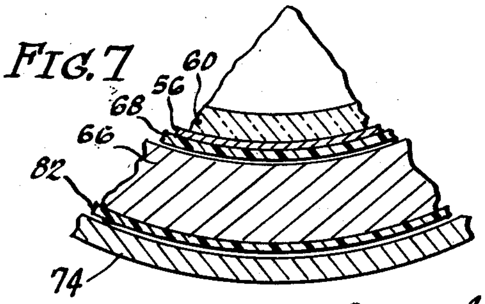
FIG. 7 is a greatly enlarged fragmentary section, taken generally along a line 7—7 in FIG. 4.

As already indicated, each band is tuned by turning the main tuning knob 22, and thereby rotating the condenser plates 34. The tuner is arranged so that it may be tracked independently in each band to predetermined tuning curves. Thus, the tuner 20 is provided with a tracking device or mechanism 110, which is coupled to the band changing knob 24. The illustrated tracking mechanism 110 comprises three condenser plates 112, 113 and 114, one for each of the three bands to be covered by the tuner. The plates 112, 113 and 114 are mounted on a rotatable shaft 116 and are staggered at equal intervals about the axis of the shaft. It will be seen that the shaft 116 is journalled in a conductive member 118 which also supports the stator plates 36. By rotating the shaft 116, the plates 112, 113 and 114 are movable successively into operative relation to adjustable tracking plates 119, 120 and 121, secured to the main tuning shaft 26. As shown to advantage in FIGS. 6A, 6B and 6C, each of the tracking plates 119, 120 and 121 is in the form of a sector of a circle, having its center coinciding with the axis of the shaft 26. With the shaft 116 positioned as shown in FIG. 6A, the tracking plate 119 is rotatable adjacent the plate 112. Unless a tracking adjustment is made, the capacitance between the plates 119 and 112 is substantially constant throughout the range of rotation of the shaft 26. However, each of the tracking plates is bendable toward and away from the corresponding condenser plate, so that tracking adjustments can be made. The bending of the tracking plates 119–121 is facilitated by forming each plate with a plurality of equally spaced radial slots 124, which divide the outer portion of the plate into a plurality of readily bendable tabs 125. To make a tracking adjustment at any point in the tuning range, the tabs 125 opposite the condenser plate 112 may be bent toward or away from the condenser plate.

If the shaft 116 is rotated through 120°, the second condenser plate 113 is moved opposite the second tracking plate 120. Further rotation of the shaft 116 through a similar interval will move the third condenser plate 114 opposite the third tracking plate 121. Thus, the tracking plate 119 may be bent to track the tuner for the UHF band. Similarly, the tracking plates 120 and 121 may be bent to track the tuner throughout the two VHF bands.

It has already been indicated that the tracking shaft 116 is coupled to the band changing knob 24, so that the tracking shaft 116 will be rotated in synchronism with the movement of the band changing sleeve 66. Of course, the tracking shaft 118 is connected to the stator plates 36, which are at a high radio frequency potential. Thus, the tracking shaft 116 is adapted to be operated by an insulating shaft 126, which extends through the front wall 41 and is journalled in a bearing 128. A gear 130 is mounted on the shaft 126 and is arranged to mesh with a larger gear 132 secured to the band changing shaft 28. The gear ratio is such that the tracking shaft 126 is rotated through two-thirds of a revolution, while the band changing sleeve 66 is being moved throughout its entire range, from the cylinder 56, as shown in FIG. 2, to the cylinder 64.

Figure 1:
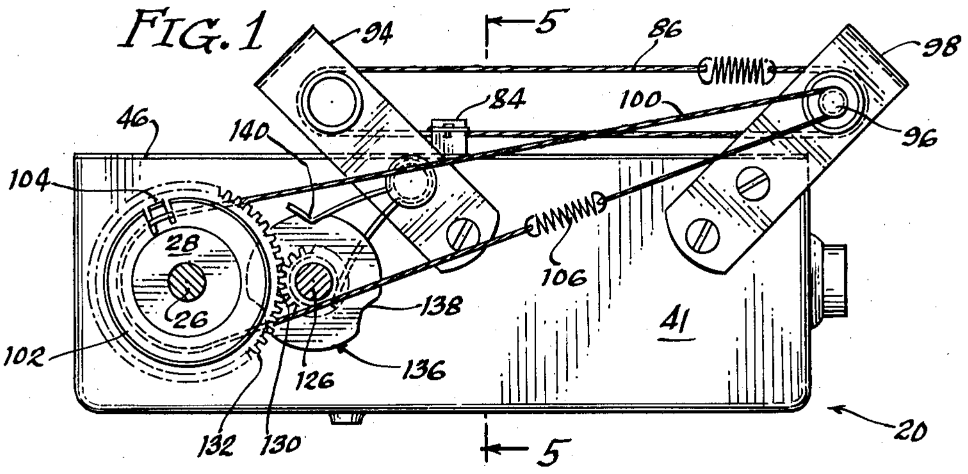
FIG. 1 is a front elevational view of a multi-band tuner to be described as an illustrative embodiment of the present invention, the view being partly in section along a line 1—1 in FIG. 2.

A suitable detent arrangement is provided to locate the band changing mechanism in its three positions. As shown in FIG. 1, a detent wheel or disk 136 is secured to the tracking shaft 126. The disk 136 is formed with three equally spaced detent notches 138 which are engageable by a spring pressed detent 140. This arrangement locates and detains the tracking shaft 116 in its three positions. Because of the meshing gears 130 and 132, the band changing shaft 28 is also detained in its three positions, at which the band changing sleeve 66 is moved over the cylinders 56, 62 and 64.

It will be recognized that several tuners of the illustrated construction may be ganged together, simply by connecting their tuning shafts and their band changing mechanisms together for concurrent operation. This may readily be accomplished by those skilled in the art.

When the band changing sleeve 66 is in the position shown in FIG. 4, around the right-hand portion of the cylindrical conductor 56, the conductive housing 38 provides a cavity resonator. The conductive tube 74 serves as a re-entrant post within the cavity resonator. Because of the close capacitive coupling between the left-hand end of the tube 74 and the cylinder 56, the latter acts as an extension of the re-entrant post. Of course, the cylinder 56 is coupled to the tube 74 by way of the movable sleeve 66, which is closely coupled to both the cylinder 56 and the tube 74. The condenser 32 is adapted to vary the capacitance between the free end of the re-entrant post and the housing 38. In this way, the resonant frequency of the cavity resonator is variable over a wide range, sufficient to cover the UHF television band.

By rotating the band changing knob 24, the band changing sleeve 66 may be moved to the right, so that it will be received around the cylindrical electrode 62. The lumped inductance of the coil 57 is thus introduced between the stator plates 36 and the housing 38. With this additional inductance, the variation of the condenser 32 now covers the high VHF television band.

Further rotation of the band changing knob 24 shifts the sleeve 66 to the right so that it is positioned around the cylindrical electrode 64. This adds the lumped inductance of the coil 58 to the tuned circuit, so that the condenser 32 will cover the lower VHF television band.

For the three bands, the condenser plates 112, 113 and 114 are successively brought into their active positions, opposite the tracking plates 119, 120 and 121, by the rotation of the tracking shaft 116. The tabs 125 on the tracking plates may be bent to provide independent tracking for each band.

FIGS. 8–11 show a modified tuner 150 which is basically the same as the tuner 20, but has a different arrangement to afford independent tracking for the three bands. In the tuner 150, the tracking plates 119, 120 and 121 are omitted, as are the corresponding condenser plates 112, 113 and 114. The tracking shaft 116 and the driving arrangement for this shaft are also omitted. These components are replaced by an arrangement whereby the band changing sleeve 66 is moved slightly in either direction from its nominal position, to make slight changes in the effective inductance of the tuner, and thereby track the tuner to predetermined tuning curves in the three bands.

As before, the band changing sleeve 66 is moved by a cord 86 attached to the post 84 extending upwardly from the sleeve 66. The cord 86 is operated by a drive which comprises a second cord 100*a*. It will be seen that the arrangement of the cord 100*a* is much the same as that of the cord 100, except that the tensioning spring 106 is moved into the upper flight of the cord 100*a*. An idler pulley 152 is engaged with the lower flight of the cord 100*a* and is adapted to be shifted slightly by the tracking mechanism, so as to move the cord 100*a* against the tension of the spring 106, and thereby shift the movable post 84.

As shown, the idler pulley 152 is mounted on one arm 154 of a two-armed lever 156, which is swingable about a pivot 158. The lever 156 has a second arm 160 which carries a cam following element in the form of a roller 162.

Figure 8:
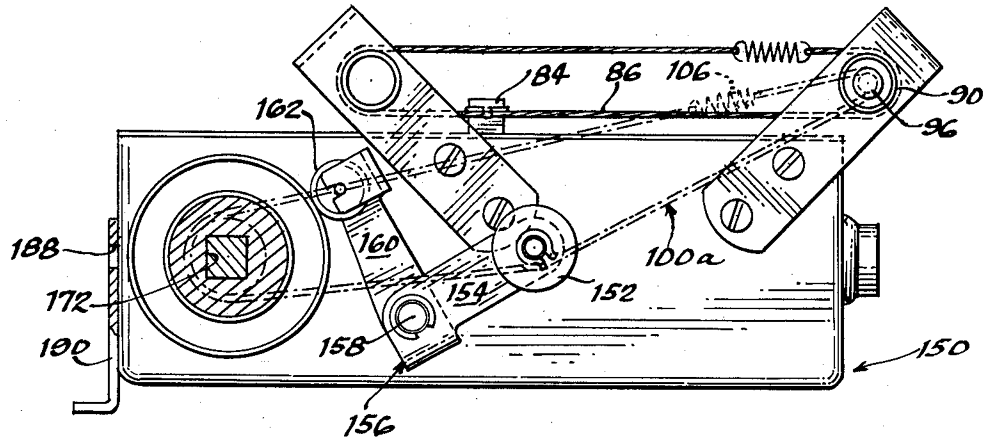
FIG. 8 is a front elevational view showing a modified tuner, the view being partly in section along a line 8—8 in FIG. 9.

The cam follower 162 is adapted to engage any one of three cams 163, 164 and 165, one cam being provided for each of the three bands to be covered by the tuner. The cams 163–165 are mounted on a hub 168 which is rotatable with but slidable along the main tuning shaft 26. Thus, as shown in FIG. 8, the shaft 26 may have a portion 170 which is noncircular in cross section, the illustrated portion being square. As shown, the square shaft portion 170 is slidably received in a square opening 172 formed in the hub 168.

The hub 168 is adapted to be moved along the square shaft 170 by a cam 176 secured to the band changing knob 24. In the illustrated arrangement, the cam 176 is engaged by a follower pin 178 which extends forwardly from a plate 180. As shown to advantage in FIGS. 9 and 10, the cam follower plate 180 engages the front end of the hub 168. Thus, the plate 180 has an opening 182 which is loosely received over a reduced portion 184 formed on the front end of the hub 168. Thus, the hub 168 is freely rotatable with respect to the plate 180. To prevent the plate 180 from rotating, it is formed with an arm 186 which extends through a slot 188 formed in a stationary guide plate 190. The slot 188 extends parallel to the axis of the shaft 26, so that the follower plate 180 will be movable along the axis of the shaft, but will be held against rotation.

The cam-supporting hub 168 is biased forwardly by a coil spring 192 which is received around the square shaft 170 between the bearing 48 and a well or recess 194 formed in the rear end of the hub 168. The spring 192 presses the hub 168 in a forward direction against the plate 180, with the result that the pin 178 is pressed against the cam 176. When the band changing knob 24 is rotated counterclockwise, the cam 176 pushes the hub 168 rearwardly. The spring 192 returns the hub 168 in a forward direction when the knob 24 is rotated clockwise. The movement of the hub 168 brings each of the tracking cams 163, 164 and 165 successively into engagement with the cam follower roller 162.

As shown to advantage in FIGS. 9 and 11, a detent arrangement is provided to locate the band changing knob 24 in each of its three positions. Thus, a detent wheel or disk 198 is secured to the knob 24. A detent member 200 is adapted to engage notches 201, 202 and 203 which are formed in the disk 198. The detent member 200 is formed at the outer end of a spring arm 206 which biases the detent member against the disk 198. Stops 208 and 209 project outwardly from the disk adjacent the notches 201 and 203, to limit the rotation of the detent disk 198.

Within each band, the operating frequency of the tuner shown in FIGS. 8–11 is varied by rotating the main tuning knob 22. This rotates the shaft 26 of the variable condenser 32, so as to move the rotor plates 34 with respect to the stator plates 36. The change in the capacity of the variable condenser 34 varies the operating frequency of the tuner so as to cover the band.

The tracking cams 163, 164 and 165 rotate with the square portion 170 of the main tuning shaft 26. Each cam is initially circular in shape, but is adapted to be bent locally, if necessary, to track the tuner to a predetermined tuning curve. Thus, each of the cams 163, 164 and 165 is formed with a thin, bendable flange or rim 212 which is adapted to engage the cam follower roller 162. The rim 212 is formed integrally with a flat disk-like radial plate 214 which extends outwardly from the hub 168. Each of the illustrated plates 214 also has an inner flange portion 216 which is received around the hub 168 and is secured thereto.

By means of a pair of pliers, a wrench or some other tool, the outer flange 212 of each of the cams 163, 164 and 165 may be bent inwardly or outwardly to form a dip or rise in the cam. Any such irregularity in the cam will cause the cam follower 162 to move as the cam is rotated. The movement of the cam follower 162 changes the position of the pulley 152 and thereby moves the lower flight of the drive cord **100*a*. Such movement of the drive cord 100*a* is transmitted to the cord 86 by the pulleys 96 and 90. Thus, the post 84 is moved slightly, so as to shift the sleeve 66 from its nominal position along the inductance element 54. As the sleeve 66** is moved to the right, the effective inductance in the circuit will be increased slightly. Movement of the sleeve to the left will decrease the inductance slightly. These slight changes in inductance are sufficient to track a tuner to a desired tuning curve.

In FIG. 9, the tuner is shown with the cam 163 against the cam follower 162. In this position, the tuner is adjusted to the UHF band. If the band changing knob 24 is rotated counterclockwise, the cord **100*a* will rotate the pulley 90 in the same direction, so as to shift the post 84 to the right. The tuning sleeve 66 will thus be moved to the right along the inductance element 54, until the sleeve is received around the cylindrical electrode portion 62**. The operating range of the tuner will thus be shifted to the high portion of the VHF band.

The cam 176 simultaneously pushes the hub 168 to the rear, so as to bring the cam 164 into engagement with the cam follower roller 162. The bendable flange portion 212 of the cam 164 may then be bent, as needed, to track the tuner to the desired tuning curve.

If the band changing knob 24 is rotated another step in a counterclockwise direction, the sleeve 66 will be shifted to the right until it is positioned around the cylindrical electrode 64. The hub 168 will be moved rearwardly until the third tracking cam 165 engages the cam follower 162. The cam 165 may then be bent, as needed, so as to track the tuner for the low portion of the VHF band.

Thus, the band changing adjustment is effected by rotating the knob 24 so as to move the sleeve 66 along the inductance element 54. This changes the inductance in the tuned circuit. Each band is covered by operating the main tuning knob 26 so as to rotate the rotor plates 34 of the variable condenser 32. The operation of the band changing knob also shifts the tracking cams 163, 164 and 165 so that each in turn is brought into play. For each band, the tuner is tracked by bending the rim of the appropriate tracking cam. The bent portion of the rim makes a slight change in the operating frequency of the tuner by moving the sleeve 66 to a slight extent from its nominal position along the inductance element 54. For the three bands, the sleeve 66 is received around the cylindrical electrode portions 56, 62 and 64. Thus, the slight movement of the sleeve from its nominal position brings about only a small change in the operating frequency of the tuner.

Various other modifications, alternative constructions and equivalents may be employed without departing from the true spirit and scope of the invention, as exemplified in the foregoing description and defined in the following claims.

I claim:

1. In a tuner for covering a plurality of ranges, the combination comprising an inductor having first, second and third portions spaced coaxially end to end, said portions being supported on a generally cylindrical form, said first portion comprising a generally cylindrical conductor mounted on the outside of said form to provide inductance for a high-frequency range, said second and third portions comprising respectively an intermediate range coil and a low range coil extending around the outside of said form, one end of said intermediate range coil being connected to the adjacent end of said cylindrical conductor, the other end of said cylindrical conductor constituting one terminal of said inductor, said inductor having a first generally cylindrical electrode connected between the other end of said intermediate range coil and the adjacent end of said low range coil, said inductive element having a second generally cylindrical electrode connected to the opposite end of said low range coil, a ring movable along the outside of said inductor into coupled relation with said cylindrical conductor and said first and second electrodes in succession, dielectric means between said ring and said inductor so that the coupling therebetween will be capacitive, a second terminal, means forming a low impedance connection between said ring and said second terminal, and means for moving said ring along said inductive element for successively activating said cylindrical conductor, said intermediate range coil and said low range coil.

2. In a tuner for covering a plurality of ranges, the combination comprising an inductor having a plurality of portions spaced coaxially end to end, said portions being supported on a generally cylindrical form, said inductor having a plurality of cylindrically curved electrode elements connected between the ends of said portions, a ring movable along the outside of said inductor into coupled relation with each of said electrode elements, dielectric means between said ring and said inductor so that the coupling therebetween will be capacitive, and means for moving said ring along said inductor for successively activating said portions to change the tuning range.

3. In a tuner for covering a plurality of ranges, the combination comprising an inductor including a cylindrical form, a plurality of coils mounted on said form and spaced end to end, generally cylindrical electrode elements mounted on said form and connected between said coils, a ring-shaped electrode movable along the outside of said inductor into coupled relation with each of said electrode elements in turn, dielectric means between said ring-shaped electrode and said electrode elements so that the coupling therebetween will be capacitive, means for establishing terminal connections to said ring-shaped electrode and to one end of said inductor, and means for moving said ring-shaped electrode along said inductor into a plurality of positions around and coupled with said electrode elements for successively activating said coils to change the tuning range.

4. In a tuner for covering a plurality of ranges, the combination comprising an inductor including a cylindrical form, a plurality of coils mounted on said form and spaced end to end, generally cylindrical electrode elements mounted on said form and connected between said coils, a ring-shaped electrode movable along the outside of said inductor into coupled relation with each of said electrode elements in turn, dielectric means between said ring-shaped electrode and said electrode elements so that the coupling therebetween will be capacitive, means for establishing terminal connections to said ring-shaped electrode and to one end of said inductor, a manually operable range changing control member, means operable by said control member for moving said ring-shaped electrode to a major extent along said inductor into a plurality of positions around and coupled with said electrode elements for successively activating said coils to change the tuning range, a manually operable tuning control member, and tracking means operable by said tuning control member for moving said ring-shaped electrode to a minor extent around any of said positions thereof.

5. In a tuner for covering a plurality of ranges, the combination comprising an inductor including a cylindrical form, a plurality of coils mounted on said form and spaced end to end, generally cylindrical electrode elements mounted on said form and connected between said coils, a ring-shaped electrode movable along the outside of said inductor into coupled relation with each of said electrode elements in turn, dielectric means between said ring-shaped electrode and said electrode elements so that the coupling therebetween will be capacitive, means for establishing terminal connections to said ring-shaped electrode and to one end of said inductor, a manually operable range changing control member, means operable by said control member for moving said ring-shaped electrode to a major extent along said inductor into a plurality of positions around and coupled with said electrode elements for successively activating said coils to change the tuning range, a manually operable tuning control member, tracking means operable by said tuning control member for moving said ring-shaped electrode to a minor extent around any of said positions thereof, said tracking means including a plurality of adjustable elements for varying the movement of said electrode, and means operable by said range changing control member for activating a different one of said adjustable elements for each of said positions of said ring-shaped electrode.

6. In a tuner for covering a plurality of ranges, the combination comprising an inductor including a cylindrical form, a plurality of coils mounted on said form and spaced end to end, generally cylindrical electrode elements mounted on said form and connected between said coils, a ring-shaped electrode movable along the outside of said inductor into coupled relation with each of said electrode elements in turn, dielectric means between said ring-shaped electrode and said electrode elements so that the coupling therebetween will be capacitive, means for establishing terminal connections to said ring-shaped electrode and to one end of said inductor, a movable range changing control member, means including an endless flexible member operable by said control member for moving said ring-shaped electrode to a major extent along said inductor into a plurality of positions around and coupled with said electrode elements for successively activating said coils to change the tuning range, said endless member having a spring connected therein, a tracking deflector movable against said endless member for making minor changes in the position of said electrode, a cam follower for moving said deflector, a rotatable tuning shaft, a plurality of cam rotatable with said tuning shaft and slidable along said tuning shaft, and means operable by said range changing control member for moving said cams along said tuning shaft sucessively into operative relation to said follower, a different one of said cams being thereby activated for each of said positions of said electrode, each of said cams having a thin wall which is locally bendable to change the position of said cam follower.

References Cited in the file of this patent

UNITED STATES PATENTS

| | | |
|---|---|---|
| 1,943,788 | Farnham | Jan. 16, 1934 |
| 2,311,522 | Conron | Feb. 16, 1943 |
| 2,460,138 | Lynn | Jan. 25, 1949 |
| 2,648,824 | Friberg | Aug. 11, 1953 |
| 2,876,403 | Wright | Mar. 3, 1956 |
| 2,808,546 | Connor | Oct. 1, 1957 |
| 2,858,440 | Giacolette | Oct. 28, 1958 |
| 2,872,824 | Coutermash | Feb. 10, 1959 |
| 2,913,681 | Lyman | Nov. 17, 1959 |
| 2,920,199 | Lyman | Jan. 5, 1960 |

FOREIGN PATENTS

| | | |
|---|---|---|
| 203,716 | Great Britain | 1925 |
| 261,155 | Great Britain | Nov. 18, 1926 |
| 975,013 | France | Feb. 28, 1951 |